United States Patent
Williams

(10) Patent No.: US 7,327,008 B2
(45) Date of Patent: Feb. 5, 2008

(54) STRUCTURE AND METHOD FOR MIXED-SUBSTRATE SIMOX TECHNOLOGY

(75) Inventor: Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,857

(22) Filed: Jan. 24, 2005

(65) Prior Publication Data

US 2006/0163687 A1    Jul. 27, 2006

(51) Int. Cl.
  H01L 29/00    (2006.01)

(52) U.S. Cl. .................. 257/507; 257/487; 257/507; 438/479

(58) Field of Classification Search .......... 257/487, 257/507; 438/479
  See application file for complete search history.

(56) References Cited

U.S. PATENT DOCUMENTS

| | | | |
|---|---|---|---|
| 5,270,265 A | 12/1993 | Hemmenway et al. | |
| 6,096,618 A * | 8/2000 | Dunn et al. | 438/328 |
| 6,333,532 B1 | 12/2001 | Davari et al. | |
| 6,521,510 B1 | 2/2003 | Fisher et al. | |
| 6,593,637 B1 | 7/2003 | Ibok | |
| 6,646,306 B2 | 11/2003 | Iwamatsu et al. | |
| 6,756,257 B2 * | 6/2004 | Davari et al. | 438/151 |
| 6,800,518 B2 | 10/2004 | Bendernagel et al. | |
| 6,878,611 B2 * | 4/2005 | Sadana et al. | 438/479 |
| 2001/0012655 A1 * | 8/2001 | Nordstom et al. | 438/239 |
| 2003/0013323 A1 * | 1/2003 | Hammond et al. | 438/981 |
| 2003/0022453 A1 | 1/2003 | Park | |
| 2004/0046216 A1 | 3/2004 | Iwamatsu et al. | |
| 2004/0132267 A1 * | 7/2004 | Sadana et al. | 438/510 |
| 2004/0227186 A1 * | 11/2004 | Saito et al. | 257/347 |
| 2005/0218463 A1 * | 10/2005 | Hao et al. | 257/411 |

OTHER PUBLICATIONS

Sleight, et al., "Stress Induced Defects and Transistor Leakage for Shallow Trench Isolated SOI", *IEEE Electron Device Letters*, vol. 20, No. 5, May 1999.

Ho, et al., "A 0.13 µm High Performance SOI Logic Technology with Embedded DRAM for System-On-A-Chip Application", IBM Microelectronics Semiconductor Research and Development Center (SRDC), Hopewell Junction, NY, *IEEE*, 2001.

* cited by examiner

*Primary Examiner*—Mary Wilczewski
*Assistant Examiner*—Tsz Chiu
(74) *Attorney, Agent, or Firm*—Scully, Scott, Murphy & Presser, P.C.; Anthony J. Canale

(57) ABSTRACT

The present invention provides a semiconductor structure that includes a substrate having a crystal lattice; a first structure formed in a first region of the substrate, the first structure includes at least a heterostructure that generates a lattice stress in said crystal lattice in the first region; and a second structure surrounding the first structure for preventing lattice stress from propagating outward from the first region of the substrate. The present invention also provides various methods for forming the semiconductor structure as well as other like structures.

9 Claims, 8 Drawing Sheets

US 7,327,008 B2

STRUCTURE AND METHOD FOR MIXED-SUBSTRATE SIMOX TECHNOLOGY

FIELD OF THE INVENTION

The present invention relates to a semiconductor structure, and more particularly to a semiconductor structure which includes a hybrid substrate that has a second structure that is capable of preventing lattice stress from propagating outward from a first structure that generates the lattice stress. The present invention also relates to methods of fabricating such as a semiconductor structure.

BACKGROUND OF THE INVENTION

In the semiconductor industry, an increasing number of chip designs are being developed that mix silicon-on-insulator (SOI) technology with bulk Si technology. For example, it is known to provide a Si wafer that includes logic devices located in an SOI region, while forming a dynamic random access memory device in a bulk region. Hybrid substrates containing these various regions that are functionalized for a specific device offer the best of several technology worlds. In a hybrid substrate including, for example, an SOI region and a bulk region, the SOI region offers higher performance, lower power consumption and better electrostatic discharge protection for logic devices, while the bulk Si provides advantages for the memory devices such as the absence of the SOI floating body effect which can introduce bias dependent threshold voltage shifts.

In the prior art, a hybrid substrate including an SOI like region and a bulk-like region are formed utilizing a patterned SIMOX (Separation by IMplantation of OXygen) process in which a patterned mask is first formed atop a surface of a Si-containing substrate. Oxygen ions are then implanted into the substrate through an opening provided in the patterned mask. The masked oxygen ion implantation step creates a discrete and isolated damaged region within the Si-containing substrate. An annealing step is then performed which causes the formation of a discrete and isolated buried oxide (BOX), i.e., SIMOX island.

A structure produced by the prior art process mentioned above is shown, for example, in FIG. 1. As shown, the mixing of a SIMOX island with bulk can create defects, particularly Si fractures, due to volume mismatch as the edges of the SIMOX island.

Co-assigned U.S. Pat. No. 6,333,532 to Davari, et al. disclose a method and structure for forming patterned SOI regions and bulk regions in the same single crystal Si-containing substrate. In one embodiment of the '532 patent, a trench can be formed through the buried oxide ends to remove high concentrations of dislocations in the single crystal Si-containing substrate. This is shown, for example, in FIG. 8 of the '532 patent. In this prior art method, there is no guarantee that for a given trench width that it will cover all of the defects because the defects are formed randomly with random lengths.

In addition to substrates containing SOI regions and bulk regions, substrates that include a heterostructure (including a plurality of heterostructure layers) with SOI regions and/or bulk regions, are highly desirable. As was the case mentioned above, hybrid substrates including heterostructure layers which induce strain can create threading defects that propagate horizontally before rising to the surface. The propagation of the threading defect may damage adjacent devices. A prior art structure including heterostructure layers is shown, for example, in FIG. 2.

In view of the above, there is a need for providing hybrid substrates that avoid the aforementioned problems with prior art hybrid substrates. In particular, there is a need for providing a hybrid substrate that includes a structure that is capable of preventing propagation of lattice stress from another structure that generates the lattice stress.

SUMMARY OF THE INVENTION

The present invention relates to a semiconductor structure that includes a substrate having a crystal lattice; a first structure formed in a first region of said substrate, said first structure comprising at least a heterostructure that generates a lattice stress in said crystal lattice in said first region; and a second structure surrounding said first structure for preventing lattice stress from propagating outward from said first region of said substrate.

The semiconductor structure of the present invention can also include SOI regions and/or bulk regions that are located on either side of the second structure. The SOI regions can include a first buried oxide and a second buried oxide which are separated, in turn, by the second structures.

In accordance with the present invention, the second structure that prevents lattice stress from propagating from the first structure to other regions is an isolation trench that is filled with a dielectric material.

In addition to providing a semiconductor structure, the present invention also provides methods of fabricating the same. One of the methods of the present invention includes the steps of forming a plurality of trenches into a substrate having a crystal lattice, said plurality of trenches defining at least a first region for a first structure that generates a lattice stress in said substrate; forming said first structure into said first region; and filling said plurality of trenches with a trench dielectric material.

Another method of the present invention includes the steps of forming a patterned hardmask having at least one opening onto a substrate having a crystal lattice; forming dielectric spacers on vertical exposed surfaces of said patterned hardmask; forming a first structure that is capable of generating a lattice stress into said substrate through said at least one opening, said first structure is located in a first region of said substrate; and forming a second structure surrounding said first structure. In one embodiment, this order is switched such that the second structure is formed prior to the forming of the first structure.

A preferred method of the present invention comprising forming a patterned hardmask having at least one opening onto a substrate having a crystal lattice; forming an inner spacer and an outer spacer on vertical exposed surfaces of said patterned hardmask; filling said opening with a dielectric material; forming at least a pair of trenches into selected portions of said substrate by removing the outer spacer and a portion of said substrate underlying the outer spacer; forming a buried implant region within said substrate between said pair of trenches; removing said inner spacer and said patterned hardmask; annealing to convert said buried implant region into a buried insulating region and filling said pair of trenches with a trench dielectric material.

In the preferred method the first structure, i.e., the buried insulating region is formed prior to forming the second structure, i.e., the trench isolation regions.

DETAILED DESCRIPTION OF THE INVENTION

The present invention, which provides a semiconductor structure comprising a hybrid substrate including mixed technologies such as, for example, SOI and bulk, as well as methods of fabricating the same will now be described in greater detail. The drawings of the present invention are provided for illustrative purposes and thus they are not drawn to scale.

Reference is first made to FIGS. 3A-3E which illustrate basic processing steps that are employed in accordance with one embodiment of the present invention. This embodiment of the present invention begins by first forming a plurality of trenches 12 into a surface of a Si-containing substrate 10 having a crystal lattice. The term "Si-containing" is used throughout the present invention to denote a material that includes silicon. Illustrative examples of Si-containing materials that can be used in the present invention include, but are not limited: Si, SiGe, SiC, SiGeC, and layered structures such as Si/SiGe. It is noted that the material system could be based in the future on a different semiconductor system besides the current silicon-based semiconductor system with the appropriate choice of materials.

The plurality of trenches 12 are formed utilizing conventional processing that is well known in the art. For example, the plurality of trenches 12 can be formed by lithography and etching. The lithographic step includes providing a photoresist, exposing the photoresist to a desired pattern of radiation and developing the exposed photoresist utilizing a conventional developer. The etching step typically comprises a dry etching process, such as reactive-ion etching, ion beam etching, or plasma etching, that selectively removes portions of the Si-containing substrate 10.

The dimensions of the trenches 12, e.g., width and depth, can vary depending on the limits of the lithographic process and the conditions of the etching step. Typically, the trenches 12 have a depth, as measured from the upper surface of the Si-containing substrate 10 to the bottom wall of the trench, from several hundred Angstroms to about 2 to about 5 nm, while the width of the trenches 12 is from about 0.1 to about 1 μm. Note that the region between the two trenches 12 shown in FIG. 3A defines the area for the first structure that generates lattice stress, while the region of each trench 12 defines the area for the second structure that is used in the present invention to prevent the propagation of lattice stress outward from the first structure.

Figure 1:
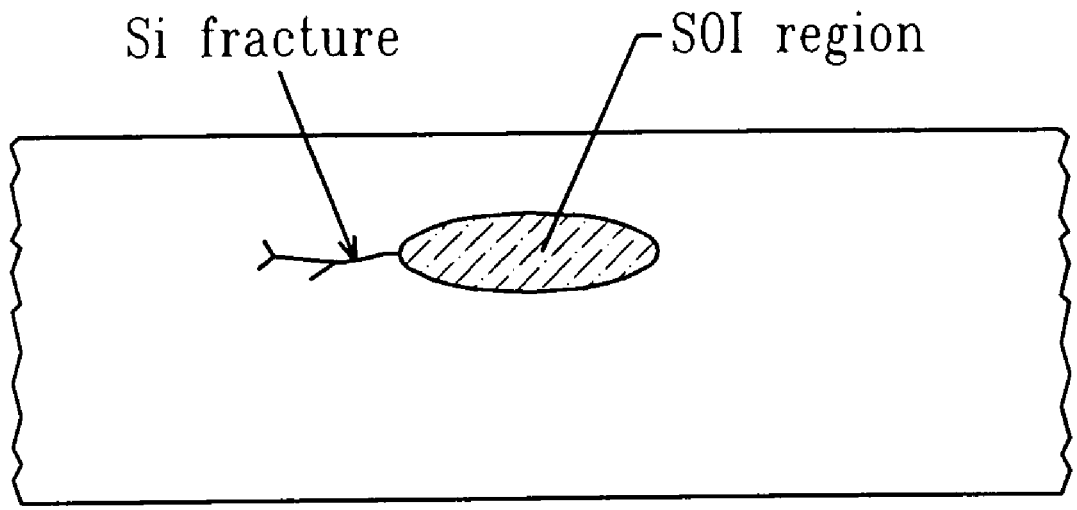
FIG. 1 is a pictorial representation (through a cross sectional view) showing a prior art hybrid substrate that includes an SOI region and a bulk region.
Figure 2:
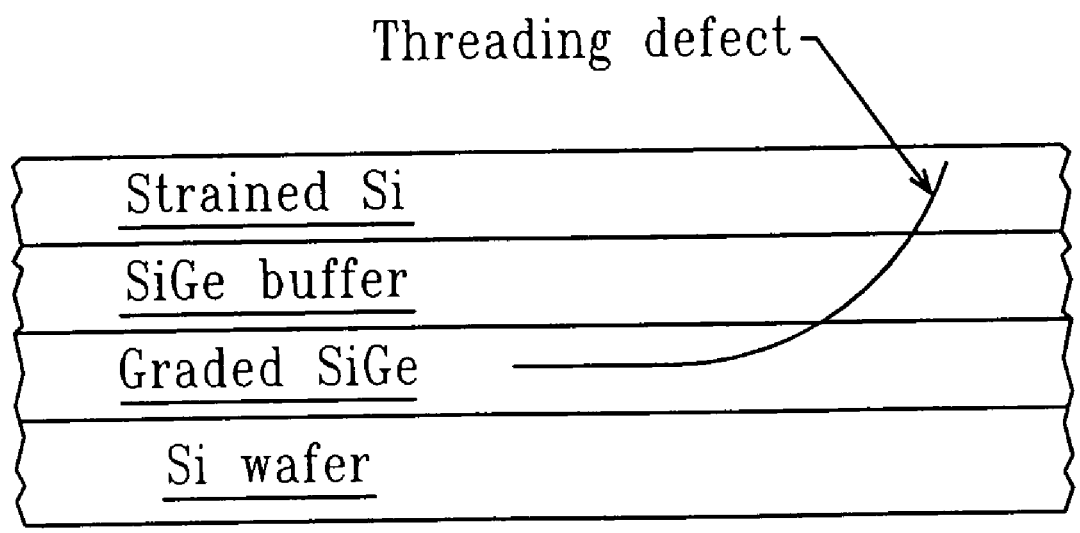
FIG. 2 is a pictorial representation (through a cross sectional view) showing the heterostructure layer portion of a prior art structure.
Figure 3A:
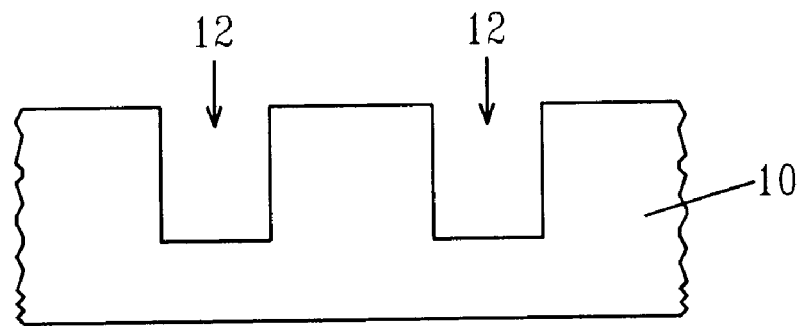
FIGS. 3A-3E are pictorial representations (through cross sectional views) illustrating the basic processing steps employed in one embodiment of the present invention.
Figure 3B:
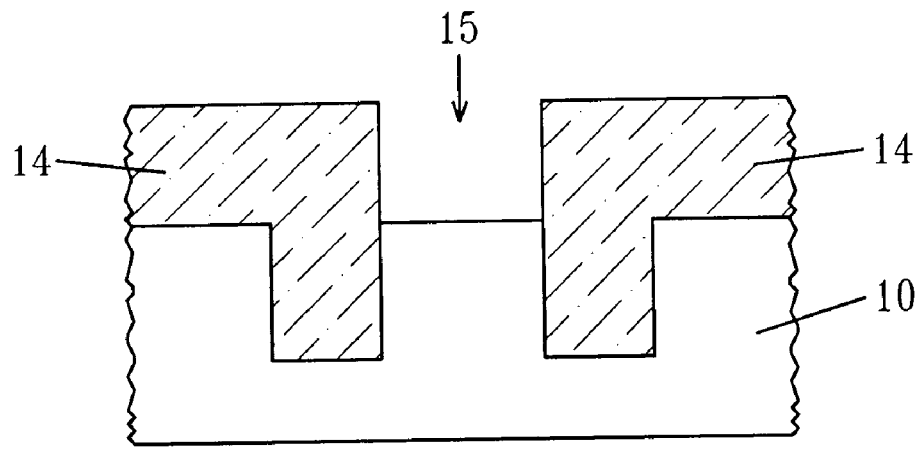

Next, and as shown in FIG. 3B, a hardmask is applied to the entire surface of the structure shown in FIG. 3A, including within each of the trenches 12, and then the hardmask is patterned by lithography and etching so as to provide a patterned hardmask 14 on the surface of the structure. The patterned hardmask 14 has at least one opening 15 that exposes a surface portion of the Si-containing substrate 10 that is contained within two adjacent trenches 12.

The hardmask material comprises an oxide, nitride or oxynitride, with oxide or nitride materials being preferred. The hardmask material is applied by a conventional deposition process such as, for example, chemical vapor deposition (CVD), plasma-enhanced chemical vapor deposition (PECVD), chemical solution deposition or evaporation. Alternatively, the hardmask material can be applied by oxidation, nitridation or oxynitridation. The thickness of the hardmask material applied to the structure is typically thick enough so that the patterned hardmask 14 can be used as an implantation mask. In general, the hardmask material has a thickness from about 50 to about 500 nm.

The lithographic step used in forming the patterned hardmask 14 is the same as described above, and the etching is performed utilizing a process that selectively removes the exposed portion of the hardmask material.

Ions 16, such as oxygen, nitrogen or a combination thereof, are then implanted into the exposed portion of the Si-containing substrate 10 through opening 15. Preferably, the ions 16 are oxygen ions. The implantation conditions used in this step of the present invention are typical for any standard SIMOX process. That is, the implant of ions 16 can be performed using an ion dose from about 1E17 to about 1E18 atoms/cm$^{-2}$ at an implant energy from about 50 to about 200 keV. A single implant can be performed or multiple implants at the same or different implant conditions can be utilized. For example, it is contemplated to perform a base ion implant step at a temperature from about 200° C. or higher, followed by a second implant that is performed at a lower implant temperature than the base ion implantation step.

In some embodiments not shown, a patterned implant step can be performed first and then the trenches 12 can be formed into the Si-containing substrate 10. Although such an embodiment is contemplated, it is not preferred since there is a higher probability of introducing ions 16 into other regions of the Si-containing substrate 10.

Figure 3C:
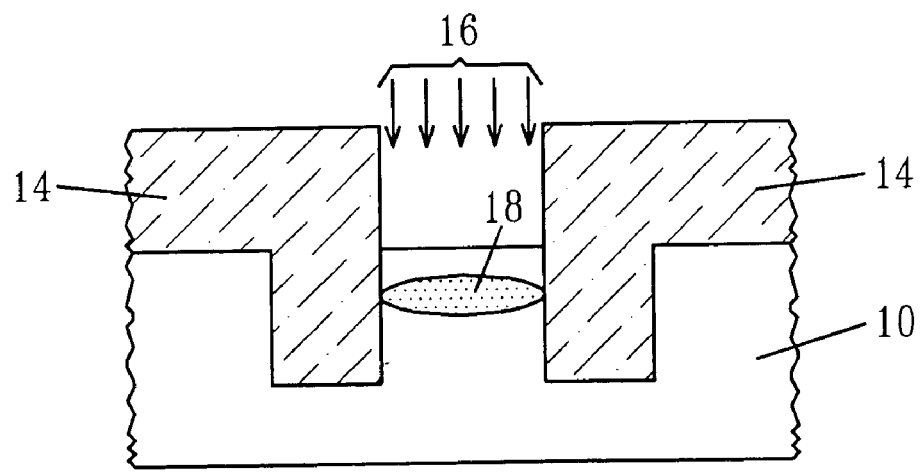

As shown in FIG. 3C, the implant of ions 16 creates a damaged region 18 containing a concentration of ions 16 that is sufficient to form a buried insulating region upon performing a subsequent thermal anneal step. The peak concentration of ions 16 within damaged region 18 is dependent on the ion dose. Typically, the peak concentration of ions 16 within damaged region 18 prior to annealing is from about $10^{21}$ to about $10^{22}$ cm$^{-3}$.

After performing the implant step, the patterned hardmask 14 is stripped from the structure utilizing a chemical etching process that selectively removes hardmask material as compared to a Si-containing material. For example, a hot phosphoric acid etch can be used to strip a silicon nitride patterned hardmask 14 from the structure. The resultant structure that is formed after removing the patterned hardmask 14 from the structure is shown, for example, in FIG. 3D. The entire surface of the structure can be cleaned after removing the patterned hardmask 14 utilizing any conventional surface cleaning technique.

In some embodiments of the present invention, an optional SiO$_2$ layer can be formed at this point of the inventive process. The optional SiO$_2$ layer can have a thickness that is several hundred Angstroms and the optional SiO$_2$ layer can be formed by deposition or thermal growth. The optional SiO$_2$ layer reduces areal defects (inside the edges of the SIMOX region).

The structure is then subjected to an annealing step that converts the damaged region 18 into a buried insulating region 20; See FIG. 3D. As shown, the buried insulating region 20, which represents one possible first structure of the present invention, is located between two adjacent trench regions 12 in a first region of the substrate 10.

Figure 3D:
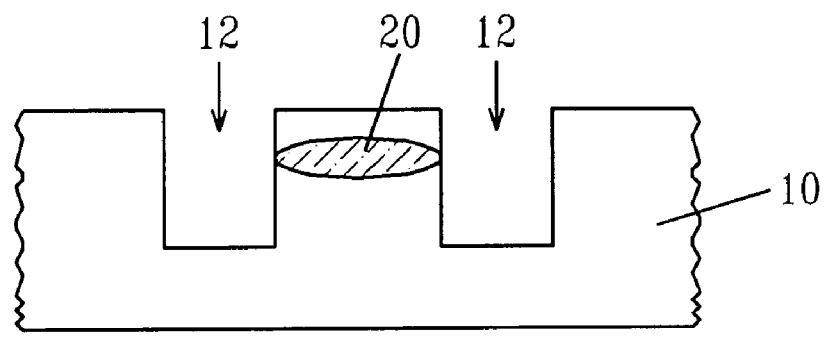

Specifically, the annealing step is performed at a temperature that is capable of precipitating the ions 16 within damaged region 18 into a buried insulating region 20. FIG. 3D also shows the structure after that anneal step has been performed. Typical, the anneal is performed at a temperature from about 1300° to about 1350° C. for a time period from about 4 to about 6 hours. Other annealing temperatures and times are also contemplated herein so long as they are capable of precipitating the implanted ions within the damaged region into a buried insulating region.

The anneal can be performed utilizing various heating regimes, including a single ramp up step or multiple ramp up steps, with multiple soaking cycles. A single cool down step can be used, or multiple cool down steps, including multiple soaking cycles, can be used.

The anneal can be performed in an inert ambient such as He, Ne, Ar, Xe, Kr, N$_2$ or mixtures thereof. Alternatively, the annealing step can be performed in an oxidizing ambient that includes greater than 2 atomic percent O$_2$. The oxidizing ambient can be admixed with one or more of the inert ambients mentioned above. In some embodiments of the present invention, a high quality thermal oxide is formed when the anneal process is performed in oxidizing ambients at high temperatures (on the order of about 1250° C. or greater). Preferably, the annealing step forms a buried oxide region.

Figure 3E:
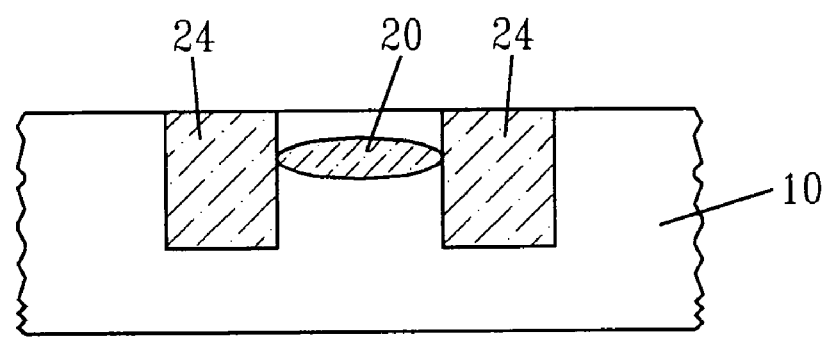

Next, and as shown in FIG. 3E, the trenches 12 are filled with a trench dielectric material such as an oxide, nitride or oxynitride providing trench isolation regions 24. The trench isolation regions 24 represent the second structure of the present invention. In accordance with the present invention, the second structure, i.e., the trench isolation regions 24, are capable of preventing propagation of lattice stress that is generated by the first structure, i.e., the buried insulating layer 20 in this embodiment.

The trench fill process includes a deposition technique such as CVD, PECVD, plasma vapor deposition (PVP) or any other like deposition process. A densification process and/or a planarization step can follow the trench fill.

At this point of the present invention, various semiconductor devices including, but not limited to: complementary metal oxide semiconductor (CMOS) devices, bipolar transistors, and memory devices can be formed upon the appropriate region of the structure shown in FIG. 3E. For example, CMOS and/or bipolar devices can be formed over the region including the buried insulator, while CMOS or memory devices can be formed in the regions of the structure including only bulk material.

After device fabrication, an interconnect structure including conductive vias and/or lines can be formed into an interlevel dielectric utilizing standard processing steps that are well known in the art.

Figure 4A:
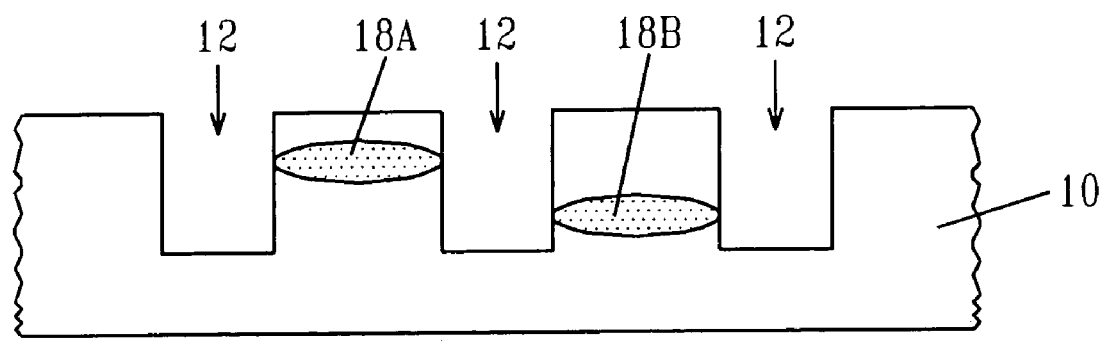
FIGS. 4A-4B are pictorial representations (through cross sectional views) illustrating the basic processing steps employed in another embodiment of the present invention.
Figure 4B:
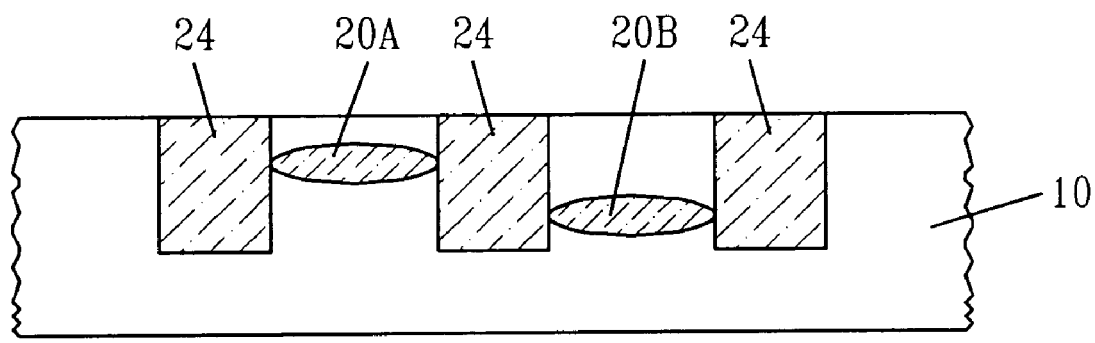

FIGS. 4A and 4B show an embodiment of the present invention in which a plurality of buried insulating regions is formed. Specifically, and in the illustrated embodiment, a first buried insulating region 20A and a second buried insulating region 20B are formed. In accordance with the present invention, the first buried insulating region 20A is formed at a first depth and the second buried insulating region 20B is formed at a second depth, wherein the two depths are different. Also, it is possible to form a first buried insulating region 20A and a second buried insulating region 20B that having different thicknesses. The two embodiments are illustrated in FIGS. 4A and 4B.

In addition to the above embodiments regarding the depths and thickness of the buried insulating regions, the present invention also contemplates that the buried insulating regions could have different widths. This feature could be used alone or in conjunction with different depths and thickness for the buried insulating regions.

The multiple buried insulating regions 20A and 20B shown in FIGS. 4A-4B are formed by repeating the steps of forming a patterned hardmask and ion implantation. The steps can be repeated multiple times depending on the desired number of SOI regions to be formed in the substrate. FIG. 4A shows a structure that is formed after repeating the steps of patterned mask formation and ion implantation twice. In the illustrated structure, damaged regions 18A and 18B are shown. FIG. 4B shows the structure of FIG. 4A after annealing and trench fill.

Figure 5:
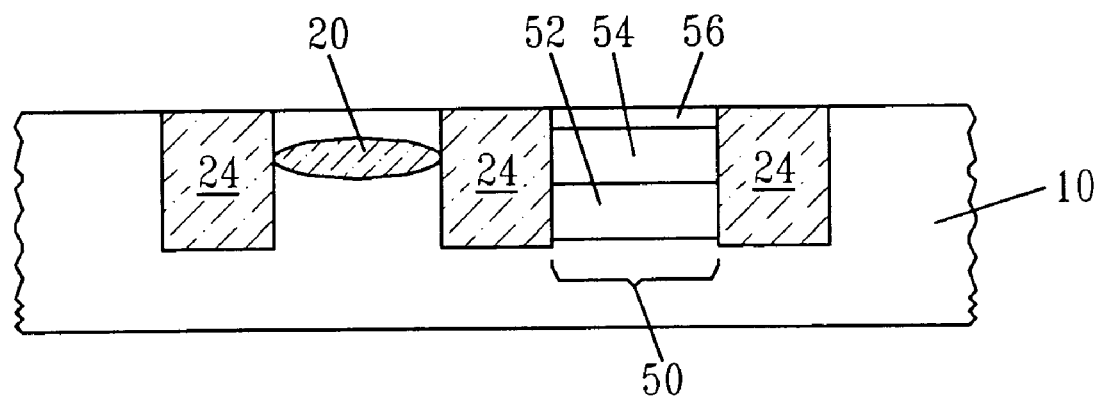
FIG. 5 is a pictorial representation (through a cross sectional view) illustrating a structure that includes an SOI region, a heterostructure region, and a bulk region.

In some embodiments of the present invention, the first structure is a heterostructure that includes a plurality of heterostructure layers instead of, or in conjunction with, the buried insulating regions. The term "heterostructure layers" is used in the present invention to denote various semiconducting layers whose lattice constants differ from each other. A typical heterostructure 50 includes a graded compositional layer 52, such as a graded SiGe layer, a buffer layer 54, such as a SiGe buffer layer, and at least one heterosturcture layer 56, such as strained Si layer, as shown in FIG. 5. The heterostructure 50 is formed by utilizing the basic processing steps as described above except that instead of implanting ions into the structure including the patterned hardmask, the exposed portion of the Si-containing substrate is recessed and the various layers of the heterostructure 50 are grown utilizing a conventional epitaxial growth process. For example, an ultra high vacuum chemical vapor deposition process having a pressure of about $10^{-8}$ or greater can be used. FIG. 5 shows a structure in which the heterostructure 50 is used in conjunction with a buried insulating region 20. Although this structure is shown, it is possible to form a structure that includes only the heterostructure 50 as the first structure and the trench isolation regions 24 as the second structure that prevents the propagation of lattice strain outward from the first structure.

Figure 6A:
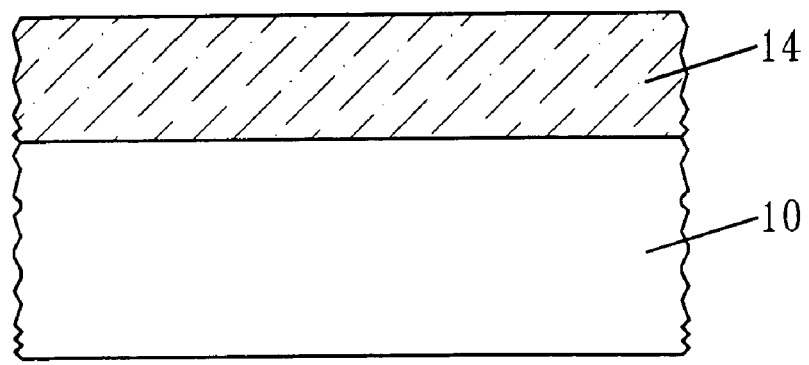
FIGS. 6A-6F are pictorial representations (through cross sectional views) illustrating a one mask process that can be used in the present invention.
Figure 6B:
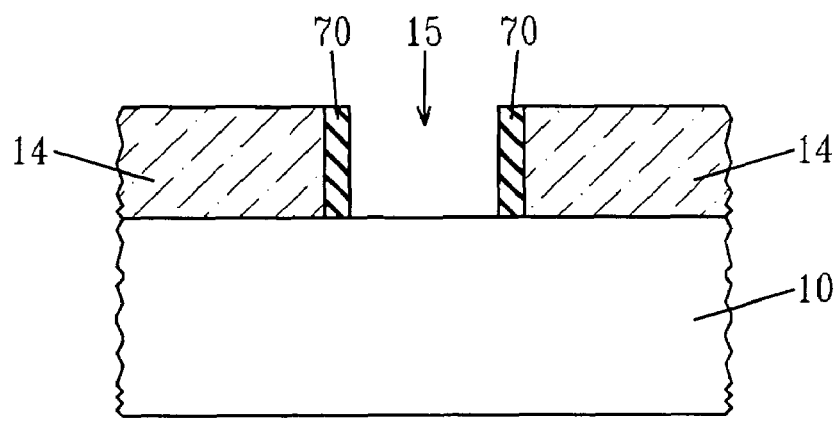

FIGS. 6A-6F show another method of the present invention. This method illustrated in FIGS. 6A-6F is simpler than the one described above in FIG. 3A-3E since only a single mask is used. Reference is first made to FIG. 6A which shows an initial structure that is employed in this embodiment of the present invention. The initial structure includes a Si-containing substrate 10 having a blanket layer of hardmask material 14 formed thereon. Next, and as shown in FIG. 6B, lithography and etching are used to form an opening 15 in the hardmask material 14. Dielectric spacers 70 are then formed on the exposed vertical sidewalls of the patterned hardmask 14 in the opening 15; See FIG. 6B. The dielectric spacers 70 are formed by deposition and etching. The dielectric spacers 70 are comprised of a different dielectric material than the hardmask 14. Thus, if hardmask 14 is comprised of an oxide, then the dielectric spacers 70 are comprised of a nitride. Although a single opening 15 is shown, it is possible to provide multiple openings 15 at this point of the present invention.

Figure 6C:
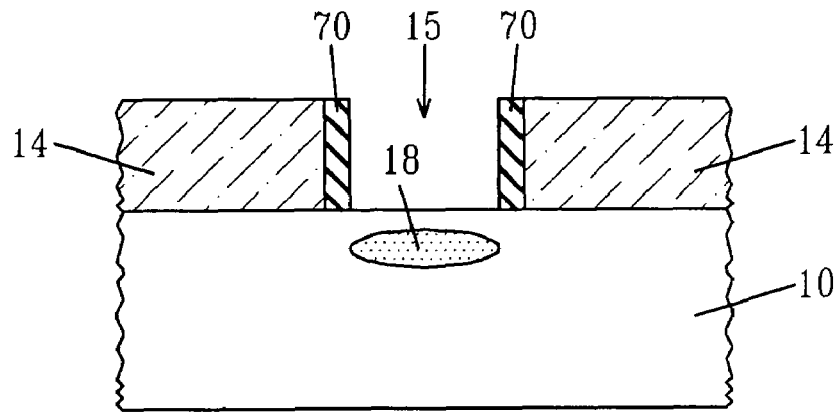
Figure 6D:
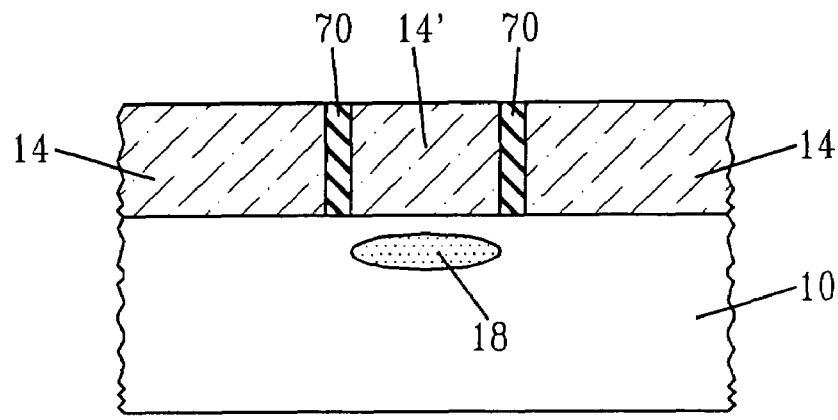
Figure 6E:
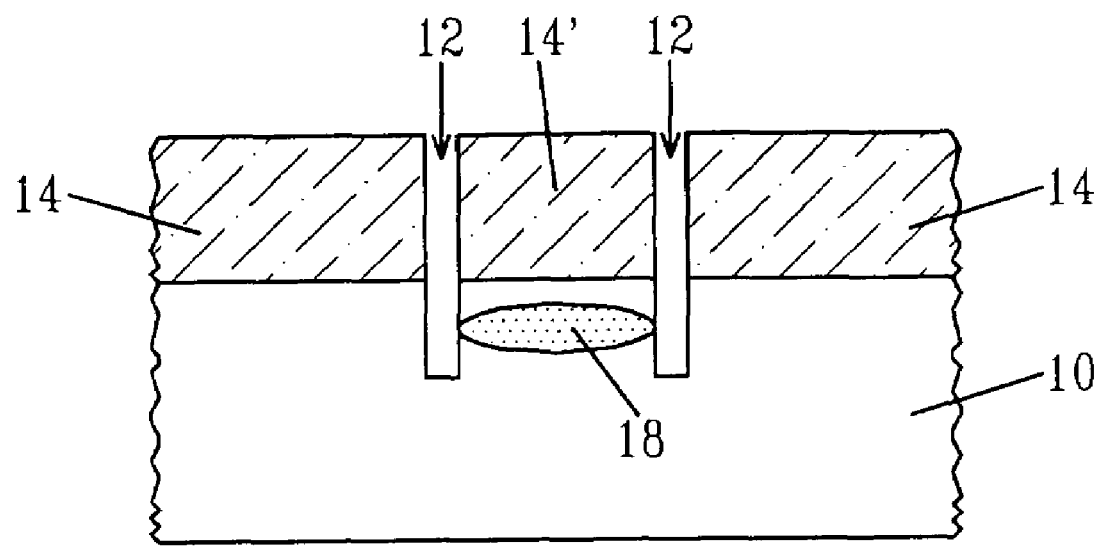
Figure 6F:
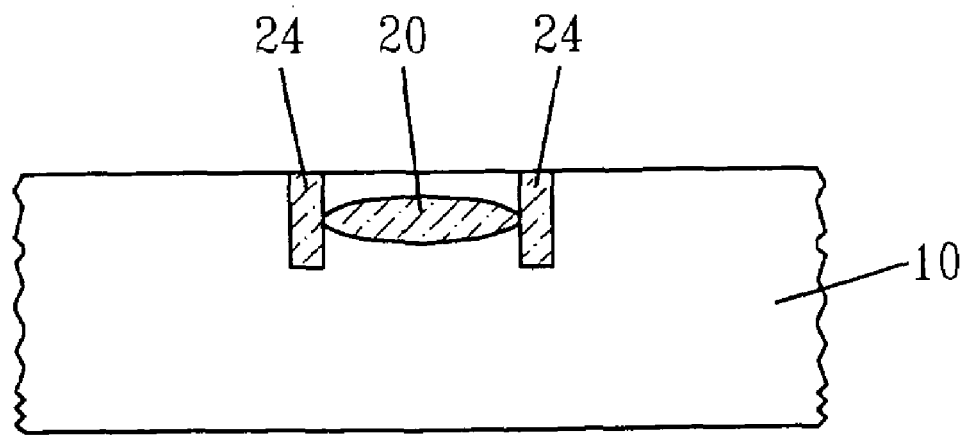

FIG. 6C shows the structure after damaged region 18 is formed into the structure. Alternatively, it is possible to form a heterostructure 50 at this point of the present invention utilizing the processing steps described above. FIG. 6D shows the structure after additional hardmask material 14' is formed into the opening. Next, the dielectric spacers 70 are removed utilizing a conventional wet etch that selectively removes the dielectric spacers 70 and the etching process continues forming trenches 12 into the Si-containing substrate 10. The resultant structure including the trenches 12 is shown, for example, in FIG. 6E.

The hardmask material 14 and 14' are then removed by planarization or etching and thereafter trenches 12 are filled with a dielectric material providing trench isolation regions 24. An annealing process, as described above, typically follows the removal of the hardmask material 14 and 14'. As indicated above, the annealing process converts the damaged region 18 into a buried insulating region 20.

It is noted that the process flow depicted in FIGS. 6C-6F can be switched such that the trench isolation regions 24 are formed prior to the formation of the buried insulating region 20.

FIGS. 7A-7F are pictorial representations (through cross sectional views) showing the inventive structure at various points during a preferred embodiment of the present invention. In the preferred embodiment, the buried insulating region is formed prior to the complete fabrication of the trench isolation regions.

Figure 7A:
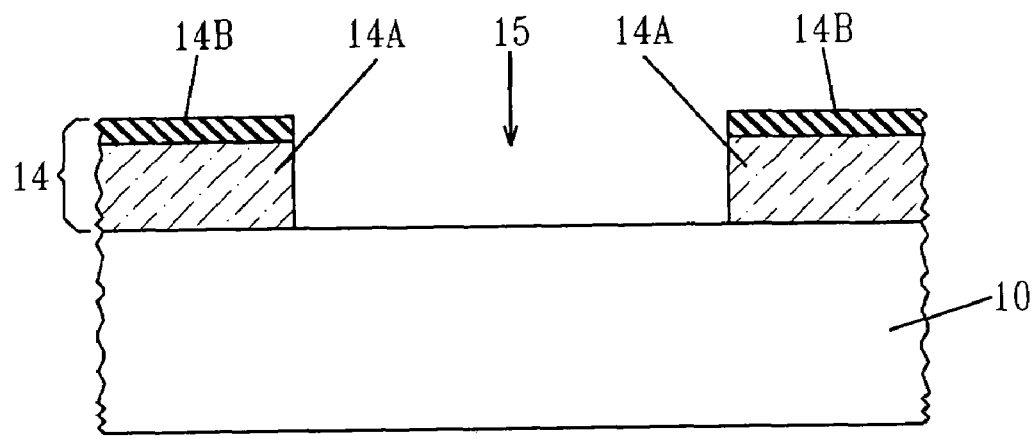
FIGS. 7A-7F are pictorial representations (through cross sectional views) illustrating a preferred method of the present invention.

FIG. 7A shows the initial structure used in the preferred embodiment of the present invention which includes a substrate 10 having a patterned hardmask 14 having at least one opening 15 located on a surface of the substrate 10. As shown, the patterned hardmask 14 comprises an upper dielectric layer 14B and a lower dielectric layer 14A. Although two layers of dielectrics are shown, the present invention contemplates a single dielectric layer for the hardmask or 3 or more dielectric layers can also be used. The hardmask may be comprised of an oxide, nitride, oxynitride or multilayers thereof. In the illustration, the upper dielectric layer 14B is comprised of a nitride and the lower dielectric 14A is comprised of an oxide. The thickness of the hardmask 14 may vary and is within ranges that are well known to those skilled in the art. In the specific embodiment illustrated, the bottom dielectric layer 14A has a thickness from about 500 to about 2000 Å, while the upper dielectric layer 14B has thickness from about 200 to about 500 Å.

The hardmask 14 is formed utilizing one or more deposition processes such as chemical vapor deposition or plasma enhanced chemical vapor deposition and patterning is achieved by lithography and etching.

Figure 7B:
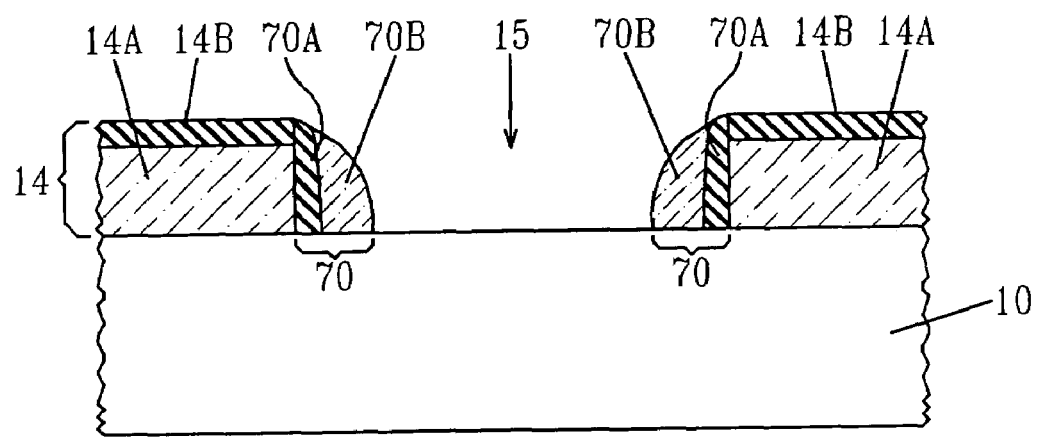

After providing the patterned hardmask 14, spacers 70 comprising an inner spacer 70A and an outer spacer 70B are formed on exposed vertical sidewalls of the patterned hardmask 14 within the at least one opening 15. The resultant structure is shown in FIG. 7B. The spacers 70 are formed by deposition and etching. The inner spacer 70A is comprised of a dielectric material that is typically the same as the upper dielectric layer 14B of the patterned hardmask 14. In a preferred embodiment, inner spacer 70A is comprised of a nitride. The inner spacer 70A is a thin spacer as compared to the outer spacer 70B. Typically, inner spacer 70A has a thickness from about 50 to about 100 Å. The outer spacer 70B is comprised of sacrificial material such as polysilicon that has a different etch rate than the inner spacer 70A. It is noted that the thickness of the outer spacer 70B will determine the width of the trenches to be subsequently formed. Typically, the outer spacer 70B has a thickness from about 100 to about 1000 Å.

Figure 7C:
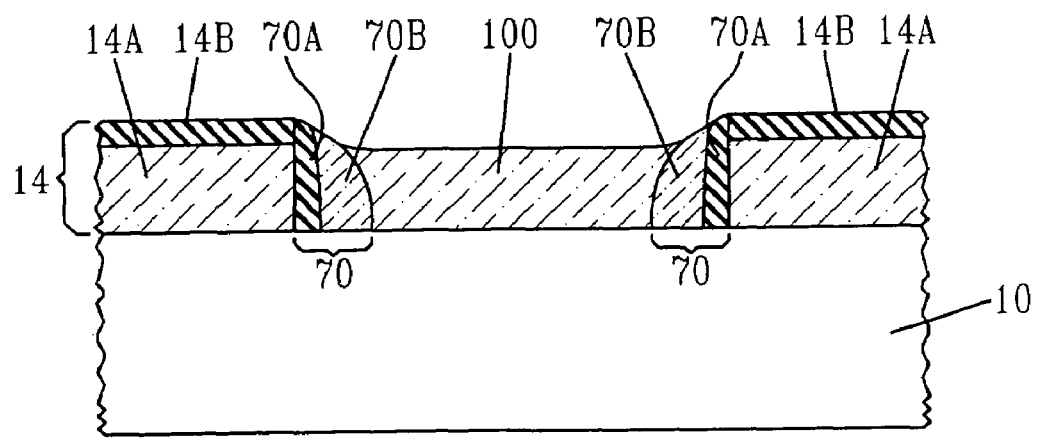

Next, and as shown in FIG. 7C, dielectric material 100 is formed within the at least one opening and thereafter the dielectric material 100 is planarized by chemical mechanical polishing. The dielectric material 100 is typically comprised of the same material as that of the lower dielectric layer 14A of the patterned hardmask 14. Thus, and in one embodiment, the dielectric material 100 is comprised of an oxide such as $SiO_2$.

Figure 7D:
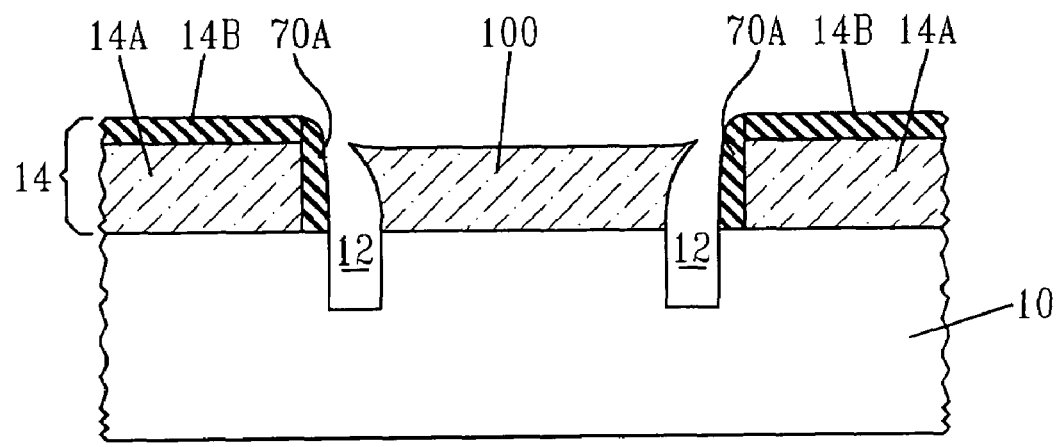

Trenches 12 are then formed into the structure by removing the outer spacer 70B and portions of the substrate 10 that underlay the outer spacer 70B, See FIG. 7D. The trenches 12 are formed by etching, such as reactive ion etching, and the depth of the trenches 12 is determined by the etch time.

Figure 7E:
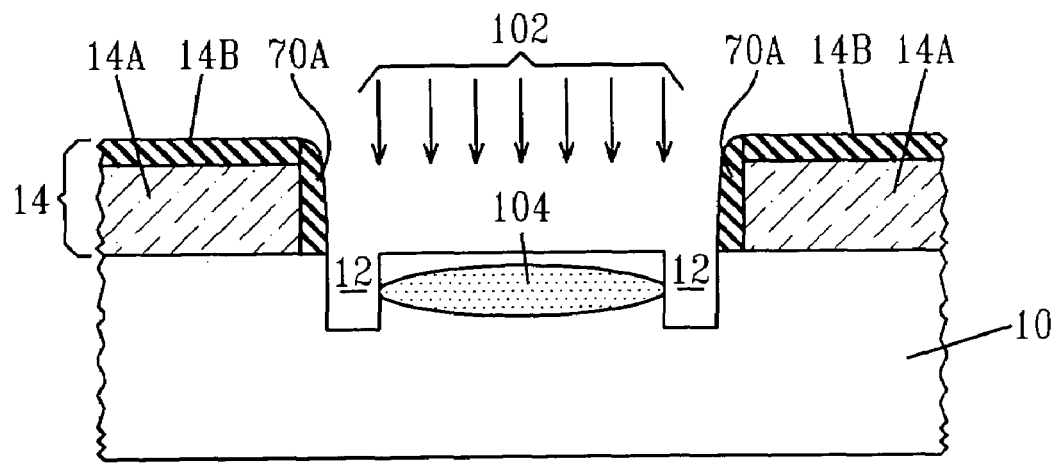
Figure 7F:
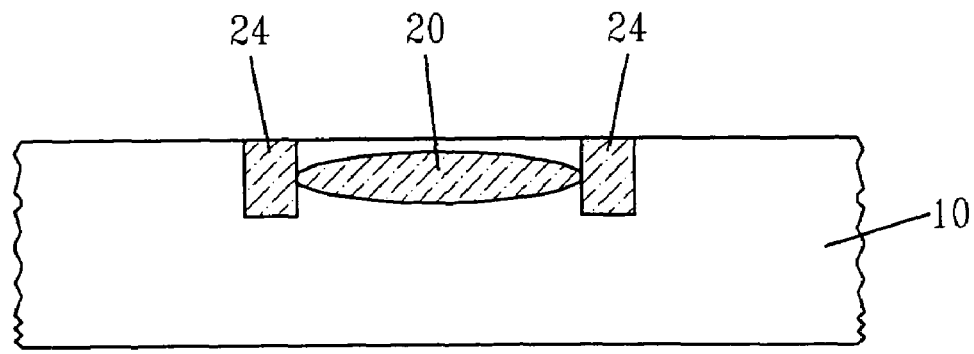

The dielectric material 100 formed previously within the at least one opening is then typically removed and ions 102 such as oxygen ions are implanted into the substrate 10 in a first region defined by the adjacent trenches 12 utilizing a conventional SIMOX process well known to those skilled in the art. The implanted ions 102 provides an implant region 104 within the substrate 10 as shown in FIG. 7E.

Next, the inner spacer 70A and the upper dielectric layer 14B of the hardmask 14 are removed followed by the removal of the lower dielectric layer 14A. An optional thermal oxide, not shown, can be formed atop the first region including the implant region 104 and a thermal anneal step can be used to convert the implant region 104 into buried insulating region 20. The thermal anneal is performed utilizing conventional annealing temperatures and times that are also well known to those skilled in SIMOX technology. If employed, the thermal oxide is stripped after the thermal anneal and the trenches 12 are filled with a trench dielectric providing trench isolation regions 24. The resultant structure formed after the aforementioned processing steps have been performed is shown, for example, in FIG. 7F.

In accordance with the present invention, a semiconductor structure is thus provided by the methods described above that includes a Si-containing substrate having a crystal lattice, a first structure that generates lattice stress, e.g., buried insulating and/or heterostructure, located in a first region of the substrate, a second structure that prevents outward propagation of the lattice stress from the first structure, e.g., isolation trench regions that surround the first structure.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A semiconductor structure comprising
   a substrate containing a silicon containing material and having a crystal lattice;
   a first structure located in said substrate, said first structure comprising at least a heterostructure that generates a lattice stress in said crystal lattice in a first region of said substrate, wherein said heterostructure contains at least one strained Si layer;
   a second structure surrounding said first structure for preventing lattice stress from propagating outward from said first region of said substrate; and a third structure located in said substrate, including a vertically abutted stack of a first layer, a buried insulating region, and a second layer, and laterally abutted and surrounded by said second structure, wherein said first layer and said second layer contain said silicon containing material, and said buried insulating region is located between said first layer and said second layer.

2. The semiconductor structure of claim 1 wherein said buried insulating region comprises an oxide.

3. The semiconductor structure of claim 1 wherein said heterostructure comprises a plurality of heterostructure layers.

4. The semiconductor structure of claim 3 wherein said plurality of heterostructure layers comprises a graded compositional layer, a buffer layer and at least one heterostructure layer.

5. The semiconductor structure of claim 1 wherein said second structure is a trench isolation region.

6. The semiconductor structure of claim 5 wherein said trench isolation region comprises a trench dielectric material.

7. The semiconductor structure of claim 6 wherein said trench dielectric material comprises one of an oxide, a nitride, or an oxynitride.

8. The semiconductor structure of claim 1 further comprising at least one first buried oxide having a first depth and at least one second buried oxide having a second depth that is different from said first depth.

9. The semiconductor structure of claim 1 further comprising at least one first buried oxide having a first thickness and at least one second buried oxide having a second thickness that is different from said first thickness.

* * * * *